United States Patent
Hayashi et al.

(10) Patent No.: US 7,420,868 B2
(45) Date of Patent: Sep. 2, 2008

(54) SEMICONDUCTOR MEMORY DEVICE

(75) Inventors: Mitsuaki Hayashi, Kyoto (JP); Shuji Nakaya, Hyogo (JP); Wataru Abe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 11/405,488

(22) Filed: Apr. 18, 2006

(65) Prior Publication Data

US 2006/0239105 A1    Oct. 26, 2006

(30) Foreign Application Priority Data

Apr. 22, 2005    (JP) .............................. 2005-124500

(51) Int. Cl.
*G11C 8/00*    (2006.01)
(52) U.S. Cl. ................. 365/230.03; 365/63; 365/230.06
(58) Field of Classification Search ............ 365/230.03, 365/63, 185.11, 230.06, 226
See application file for complete search history.

(56) References Cited

U.S. PATENT DOCUMENTS

| | | | | |
|---|---|---|---|---|
| 6,058,065 | A | * | 5/2000 | Lattimore et al. ...... 365/230.03 |
| 6,920,058 | B2 | | 7/2005 | Morikawa |
| 2006/0221754 | A1 | * | 10/2006 | Abe et al. .............. 365/230.03 |

FOREIGN PATENT DOCUMENTS

JP    06176592    6/1994

* cited by examiner

*Primary Examiner*—Gene N. Auduong
(74) *Attorney, Agent, or Firm*—Dickinson Wright, PLLC

(57) ABSTRACT

Subarrays, which constitute a memory cell array, each include a bit line driving transistor having a drain connected to a bit line, a source is connected to an interconnection having a power supply potential, and a gate is connected to a sub-bit line. The plurality of memory cells are each provided in such a way that a gate is connected to a word line, a source is grounded, and whether a drain is connected to the sub-bit line or not is selected in correspondence to data to be stored. Transmission transistors each have a gate connected to the bit line, a source connected to a loading transistor section, and a drain connected to the sub-bit line.

4 Claims, 13 Drawing Sheets

SEMICONDUCTOR MEMORY DEVICE

BACKGROUND OF THE INVENTION

1. Field of the Invention

The present invention relates to a semiconductor memory device and more particularly to a memory cell array suitable to lower the threshold values of memory cells through the use of low power supply voltage and the microfabrication of a semiconductor memory device.

2. Description of the Related Art

Related art semiconductor memory devices include one disclosed in JP-A No. 6-176592. The patent publication discloses a configuration of a contact-type mask ROM in paragraphs 0002 to 0006 of page 2 and FIG. 2.

FIG. 11 is a block diagram showing the configuration of a semiconductor memory device which represents the mask ROM described above. The semiconductor memory device shown in FIG. 11 comprises a memory cell array 1, an address buffer 2, a row decoder 3, a column decoder 4, and a read circuit 5.

The memory cell array 1 is constituted by subarrays MS (i, j) (i=1 to m and j=1 to n) arranged in the form of a matrix. In the subarrays MS (i, j), the subarrays whose letters i's are represented by the same numeral, that is, the subarrays arranged in the same rows are connected to common block selection lines SLi (i=1 to m) and word lines WLk_i (k=1 to y and i=1 to m). Also, in the subarrays MS (i, j), the subarrays whose letters j's are represented by the same numeral, that is, the subarrays arranged in the same columns are connected to common bit lines MBLj (j=1 to n).

The address buffer 2 outputs address signals to the row decoder 3 and the column decoder 4 according to an address input.

The row decoder 3, which receives the address signal outputted from the address buffer 2 as an input, is connected to the memory cell array 1 via the block selection lines SLi (i=1 to m) and word lines WLk_i (k=1 to y and i=1 to m). The row decoder 3 makes one of the block selection lines SLi (i=1 to m) transition to a selected state and also makes one of the word lines WLk_i (k=1 to y and i=1 to m) transition to a selected state according to the inputted address signal.

The column decoder 4, which receives the address signal outputted from the address buffer 2 as an input, is connected to the bit lines MBLj (j=1 to n) and the read circuit 5. The column decoder 4 selects one from among the bit lines MBLj (j=1 to n) according to the inputted address signal to bring a path between the selected bit line MBLj (j=1 to n) and the read circuit 5 into conduction.

The read circuit 5 connected to the column decoder 4 has functions of amplifying the signal sent from the bit line MBLj (j=1 to n) selected by the column decoder 4 to output the amplified signal to the outside as data, conducting precharge or discharge, and supplying an electric charge in response to electric charge leakage.

FIG. 12 is a circuit diagram of a subarray included in the contact-type memory cell array described above of the mask ROM shown in FIG. 11. The term contact-type mask ROM means a ROM in which a state of connecting drains of memory cells to sub-bit lines is brought into correspondence with "0" of stored data and a state of not connecting them is brought into correspondence with "1" of the stored data.

The related art subarrays MS (i, j) (i=1 to m and j=1 to n) shown in FIG. 12 each comprises a N-type MOS transistor QNT and memory cells MNk (k=1 to y) each formed of a N-type MOS transistor.

In the N-type MOS transistor QNT, a gate is connected to the block selection line SL, a drain is connected to the bit line MBL, and a source is connected to a sub-bit line SBL.

In the memory cells MNk (k=1 to y), gates are connected to the word lines WLk (k=1 to y) and sources are connected to interconnections having a ground potential. When stored data is "0", the drains of the memory cells MNk (k=1 to y) are connected to the sub-bit line SBL and when the stored data is "1", the sub-bit line SBL is brought to the floating state.

Moreover, in the memory cell array 1 shown in FIG. 11, the block selection line SL, the word lines WLk (k=1 to y) and the bit line MBL are connected to the corresponding block selection lines SLi (i=1 to m), word lines WLk_i (k=1 to y and i=1 to m), and bit lies MBLj (j=1 to n) of the subarrays MS (i, j) (i=1 to m and j=1 to n) respectively.

The operation of reading data from, for example, the memory cell MN1 of the subarray MS (1, 1) of the semiconductor memory device having such a configuration will be described with reference to a timing chart of FIG. 13.

In response to an address input, a block selection signal SL1 is made to transition to a "H" level. Then the transistor QNT of the subarray MS (1, 1) is turned on and the bit line MBL1 and the read circuit 5 are brought into conduction by the column decoder 4. Thereafter, the bit line MBL1 and the sub-bit line SBL of the subarray MS (1, 1) are charged for a fixed time period by using the precharge function of the read circuit 5 to be made to transition to a "H" level, following which the word line WL1_1 is made to transition to the "H" level.

As a result, when the drain of the memory cell MN1 of the subarray MS (1, 1) is connected to the sub-bit line SBL, the charges supplied to the sub-bit line SBL and the line MBL1 are discharged by the memory cell MN1, thereby the sub-bit line SBL and the bit line MBL1 are pulled down to the "L" level.

When the drain of the memory cell MN1 is not connected to the sub-bit line SBL, the charges supplied to the sub-bit line SBL and the bit line MBL1 are not discharged by the memory cell MN1 and hence, the sub-bit line SBL and the bit line MBL1 keep the "H" level.

As a consequence, when the drain of the memory cell MN1 is connected to the sub-bit line SBL, the read circuit 5 outputs "L" level data to the outside. In contrast, when the drain of the memory cell MN1 is not connected to the sub-bit line SBL, the read circuit 5 outputs "H" level data to the outside.

According to such a related art, all the memory cells can be connected to the corresponding bit lines by dividing the memory cells among the subarrays instead of direct-connecting all memory cells arranged on a single bit line to a bit line. Because of this, it becomes possible to considerably reduce drops in the levels of the bit lines resulting from the fact that after precharge, the electric charges are discharged due to the occurrence of off-leakage currents from all the memory cells whose gates are connected to the nonselected word lines and whose drains are connected to the bit lines. Therefore, in microfabrication process, during which off-leakage currents increase, as well, a large-scale memory array can be realized.

Problems produced by such a related art semiconductor memory device are as described below. In the related art semiconductor memory device, the drain and source of the block selecting transistor QNT, which is the N-type MOS transistor whose gate is connected to the block selection line SL, are connected to the bit line MBLj (j=1 to n) and the sub-bit line SBL respectively instead of being grounded. Because of this, a threshold voltage is increased due to a substrate bias effect. The influence of the threshold voltage increased due to the substrate bias effect becomes great as a power supply voltage is decreased. As power consumption by portable equipment and so on including the semiconductor memory devices is reduced, power supply voltages for the semiconductor memory devices are lowered increasingly; however, the on resistance of the block selecting transistor QNT is increased considerably. On account of this, when the bit line is pre-charged by the read circuit 5, it takes time to charge the sub-bit line SBL and a charge time for the bit line BMLj (j=1 to n) lengthens. Likewise, when the electric charge supplied to the bit line MBLj (j=1 to n) is discharged as well, the discharge time lengthens due to the on resistance of the block selecting transistor QNT. Therefore, it has become impossible to rapidly read data stored in the memory device.

In addition, the threshold voltage of the block selecting transistor QNT becomes higher than that of the memory cells due to the substrate bias effect. Because of this, a power supply voltage at which the transistor QNT is turned off becomes higher than that of the memory cells, which has become a big factor that raises the power supply voltage at which the semiconductor memory device can be operated. Therefore, such a factor has become a big problem in reading data from a semiconductor memory device at a lowered voltage.

For these reasons, a method for lowering only threshold voltages at part of transistors during their manufacture and a method for reducing on resistance and substrate bias effect by boosting gate voltages at part of transistors have been proposed in recent years.

However, to lower the threshold voltages during the manufacture, a special manufacturing process is required in addition to their ordinary manufacturing process and to boost the gate voltages, there is a need to add a booster circuit having a relatively large area and hence, the areas of the semiconductor memory devices are increased. Because of these, the both methods have a drawback in that the production cost of the semiconductor memory devices rises.

SUMMARY OF THE INVENTION

The present invention is made to solve such problems with the related art and hence, an object of the invention is to provide a semiconductor memory device in which subarrays can be formed without connecting drains and sources of transistors, which are used for selectively connecting bit lines and sub-bit lines, to the bit lines and the sub-bit lines respectively, time periods during which the bit lines are charged and discharged can be shortened, and a read limit can be obtained at a lowered voltage without undergoing the influence of a substrate bias effect.

To solve the problems, the semiconductor memory device according to the invention has a memory cell array which includes the plurality of subarrays arranged in the form of a matrix and a plurality of word lines and the plurality of bit lines connected to the subarrays respectively. The subarrays each include a bit line driving transistor which drives the bit line, the sub-bit line connected to the gate of the bit line driving transistor, and a plurality of memory cell transistors which drive the sub-bit line according to signals from the word lines.

According to such a configuration, the bit line driving transistor is provided to each subarray, the gate of the bit line driving transistor is connected to the sub-bit line, and the memory cell transistors are driven by the sub-bit line, thereby the bit line can be charged and discharged rapidly without undergoing the influence of the on resistance of the selected transistors whose sources and drains are connected to the bit lines and the sub-bit lines respectively described in the section of the related art. And further, the read limit can also be obtained at the lowered voltage without undergoing the influence of the substrate bias effect.

In the semiconductor memory device according to the invention, it is preferable that the bit line driving transistor have a drain connected to the bit line and a source connected to a first power potential supply line, the memory cell array further include a plurality of block selection lines connected to the subarrays, and the individual subarrays further include a resetting transistor having a gate connected to the block selection line, a source connected to the first power potential supply line, and a drain connected to the sub-bit line.

Instead of having the resetting transistors, the semiconductor memory device according to the invention may have the following configuration: the individual subarrays further include a loading transistor having a gate connected to the bit line, a drain connected to the sub-bit line, and a source connected to the first power potential supply line.

According to such a configuration in which the loading transistors are provided, the sub-bit lines are not brought to the floating state and the potential of the sub-bit line does not fluctuate significantly by virtue of interference from interconnections provided near the subarrays from which data is to be read. As a result, the degree of freedom in the arrangement of interconnections in the memory cell array heightens, which makes it possible to realize the semiconductor memory device whose area is reduced.

Moreover, instead of having the resetting transistors, the semiconductor memory device according to the invention may have the following configuration: the individual subarrays further include a transmission transistor, which has a gate connected to the bit line and a drain connected to the sub-bit line, and a loading transistor or a loading transistor section which includes a series circuit constituted by plural loading transistors whose gates are connected each other and which has a configuration where the gates is connected to the second power potential supply line, the outermost source is connected to the first power potential supply line, and the outermost drain is connected to the source of the transmission transistor.

According to the configuration where the transmission transistors and the loading transistor sections are provided, the sub-bit lines are not brought to the floating state and the potential of the sub-bit lines does not fluctuate significantly by virtue of the interference from the interconnections provided near the subarrays from which data is to be read. As a consequence, the degree of freedom in the arrangement of the interconnections heightens, which makes it possible to produce the semiconductor memory device whose area is reduced. And furthermore, when the lengths of the loading transistors are increased to decrease their ON-state currents as well, the load capacities of the bit lines are not increased and therefore, a high-speed operation can be achieved.

The semiconductor memory device according to the invention may have a configuration where the single resetting transistor is provided to the plural subarrays, which receive input from the same block selection line, as one common resetting transistor by connecting the drain of the common resetting transistor to the sub-bit lines of the subarrays.

According to this configuration, since the common resetting transistor is provided to the subarrays, it is possible to realize the semiconductor memory device whose area is reduced.

Moreover, the semiconductor memory device according to the invention may have a configuration where the single loading transistor or the single loading transistor section is provided to the plural subarrays as one common loading transistor or one common loading transistor section by connecting the common loading transistor or the common loading transistor section to the individual sources of the transmission transistors of the subarrays.

According to this configuration, since the common loading transistor or the common loading transistor section is provided to the subarrays, it is possible to realize the semiconductor memory device whose area is reduced.

And further, in such a configuration of the semiconductor memory device according to the invention, the memory cell transistors are each provided in such a way that, for example, the gate is connected to the word line, the source is connected to the second power potential supply line, and the connection of the drain to the sub-bit line depends on data to be stored.

Still further, in such a configuration of the semiconductor memory device according to the invention, the memory cell transistors are each provided in such a way that the gate is connected to the word line, the source is connected to the second power potential supply line, the drain is connected to the sub-bit line, and a threshold value may vary in correspondence to stored data.

As described above, according to the invention, by forming the subarrays without connecting the drains and sources of the block selecting transistors, which selectively connect the bit lines and the sub-bit lines, to the bit lines and the sub-bit lines respectively, the semiconductor memory device can be realized in which the read operation can be performed at high speed and the read limit can be obtained at a lowered voltage without undergoing the influence of the on resistance of the block selecting transistors and the substrate bias effect.

In addition, unlike the foregoing methods for lowering only the threshold voltage at the part of the transistors during their manufacture and for reducing the on resistance and the substrate bias effect by boosting the gate voltage at the part of the transistors, the invention does not require a special manufacturing process adopted to lower the threshold voltage and a booster circuit having a large area used to boost the gate voltage and hence, the semiconductor memory device whose increase in area and rise in production cost are suppressed can be realized.

DESCRIPTION OF THE EXEMPLARY EMBODIMENTS

First Embodiment

Figure 1:
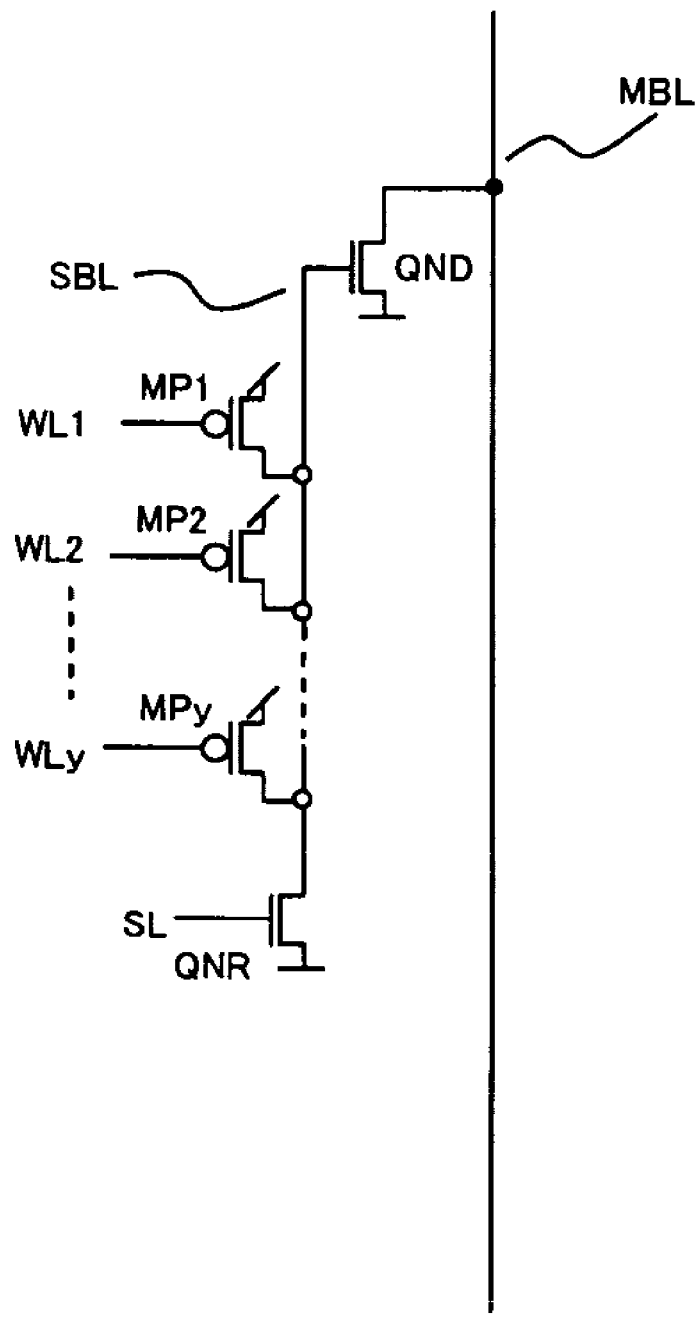
FIG. 1 is a circuit diagram of a configuration of a subarray included in a semiconductor memory device according to a first embodiment of the present invention.
Figure 11:
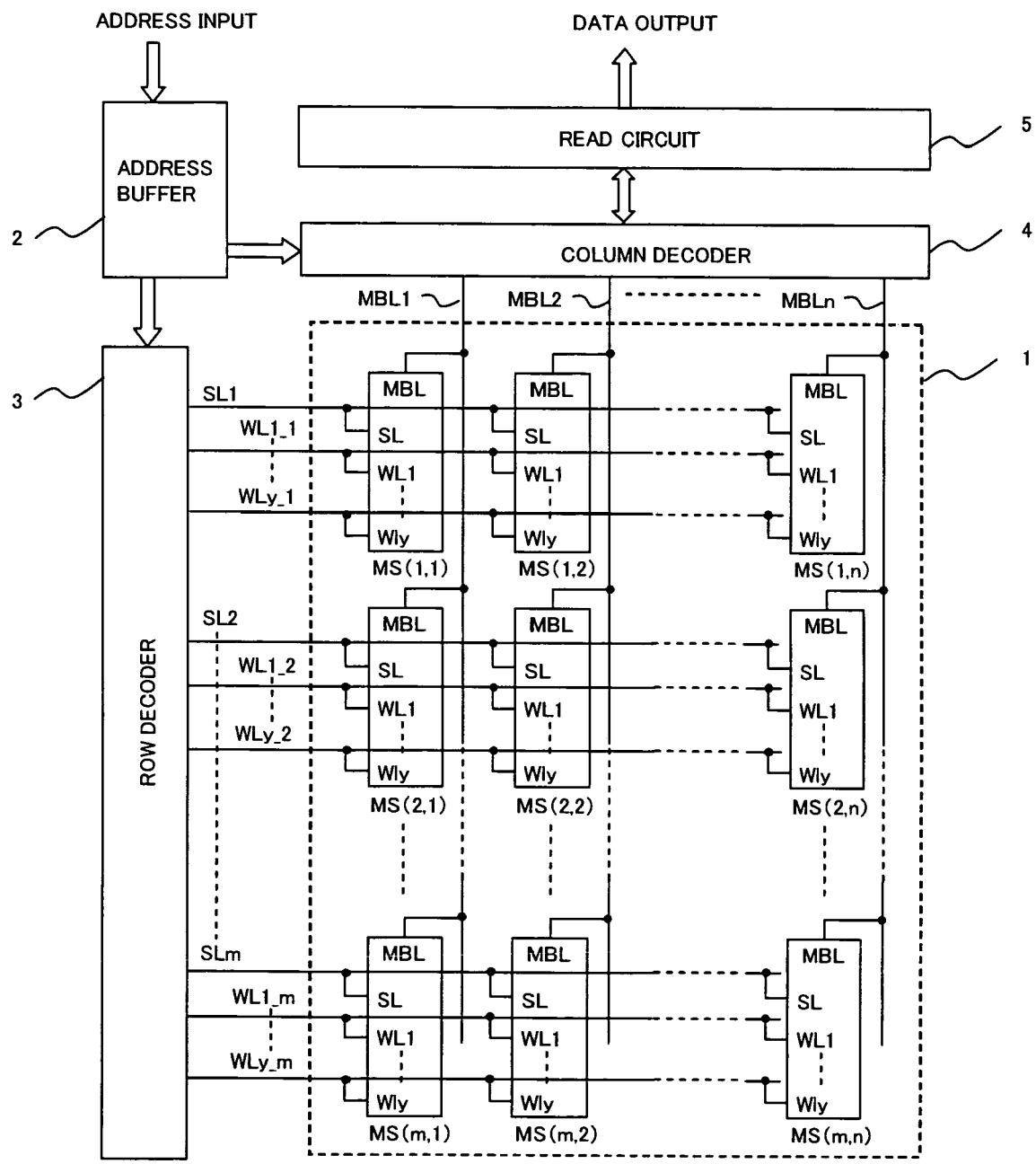
FIG. 11 is a circuit diagram of a configuration of the semiconductor memory devices.
Figure 12:
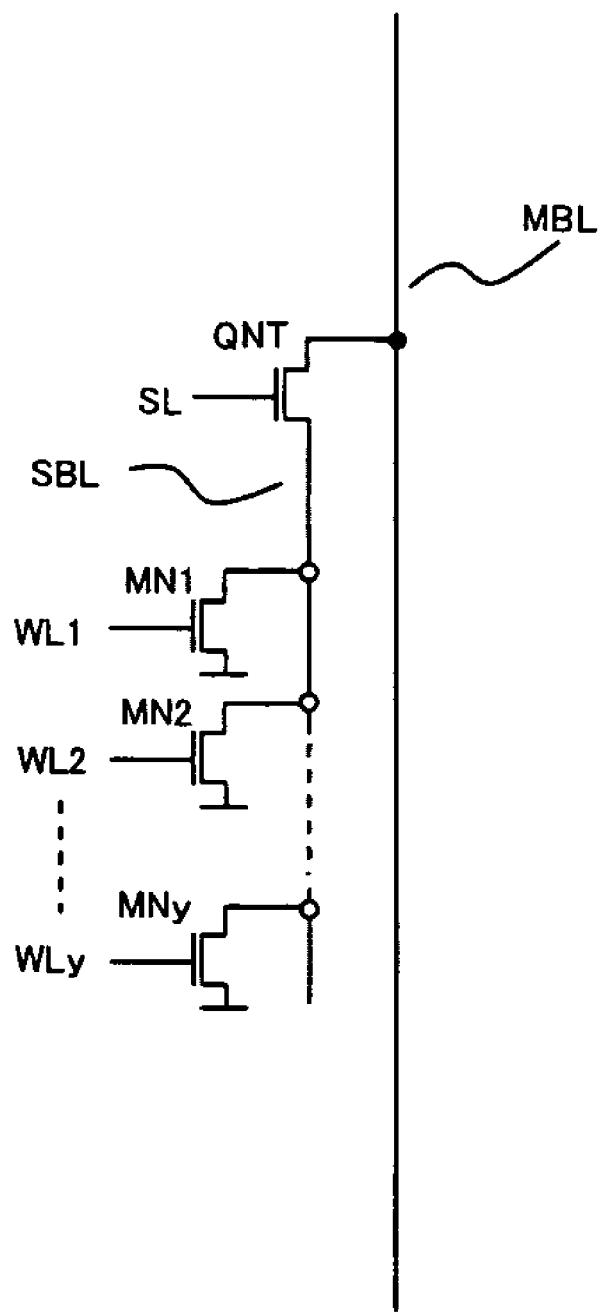
FIG. 12 is the circuit diagram of the configuration of the subarray included in the conventional art semiconductor memory device.
Figure 13:
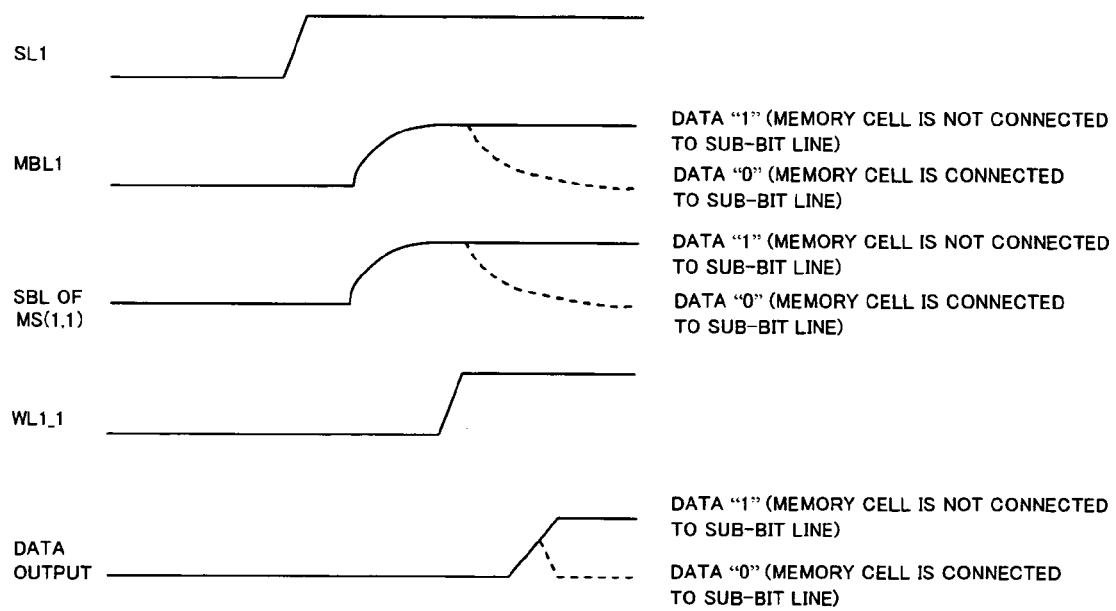
FIG. 13 is the timing chart for showing the operation of the conventional art semiconductor memory device.

FIG. 1 is a circuit diagram showing a subarray MS (i, j) (i=1 to m and j=1 to n) which is included in the memory cell array 1 of a semiconductor memory device according to a first embodiment of the present invention (see FIG. 11).

The subarray MS (i, j) (i=1 to m and j=1 to n) shown in FIG. 1 comprises a bit line driving transistor QND which is a N-type MOS transistor, memory cells MPk (k=1 to y) each comprised of a P-type MOS transistor, and a sub-bit line resetting transistor QNR which is a N-type MOS transistor.

In the bit line driving transistor QND, a gate is connected to a sub-bit line SBL, a drain is connected to a bit line MBL, and a source is connected to an interconnection having a ground potential.

In the memory cells MPk (k=1 to y) which drive the sub-bit line SBL, each gate is connected to a word line WLk (k=1 to y) and each source is connected to an interconnection having a power supply potential. When stored data is "0", the drains of the memory cells MPk (k=1 to y) are connected to the sub-bit line SBL and when the stored data is "1", the sub-bit line SBL are brought to the floating state.

In the sub-bit line resetting transistor QNR, a gate is connected to a block selection line SL, a drain is connected to the sub-bit line SBL, and a source is connected to the interconnection having the ground potential.

Moreover, in the memory cell array 1 shown in FIG. 11, the block selection line SL, the word lines WLk (k=1 to y), and the bit line MBL are connected to corresponding block selection lines SLi (i=1 to m), word lines WLk_i (k=1 to y and i=1 to m), and bit lines MBLj (j=1 to n) of the subarrays MS (i, j) (i=1 to m and j=1 to n) respectively.

Figure 2:
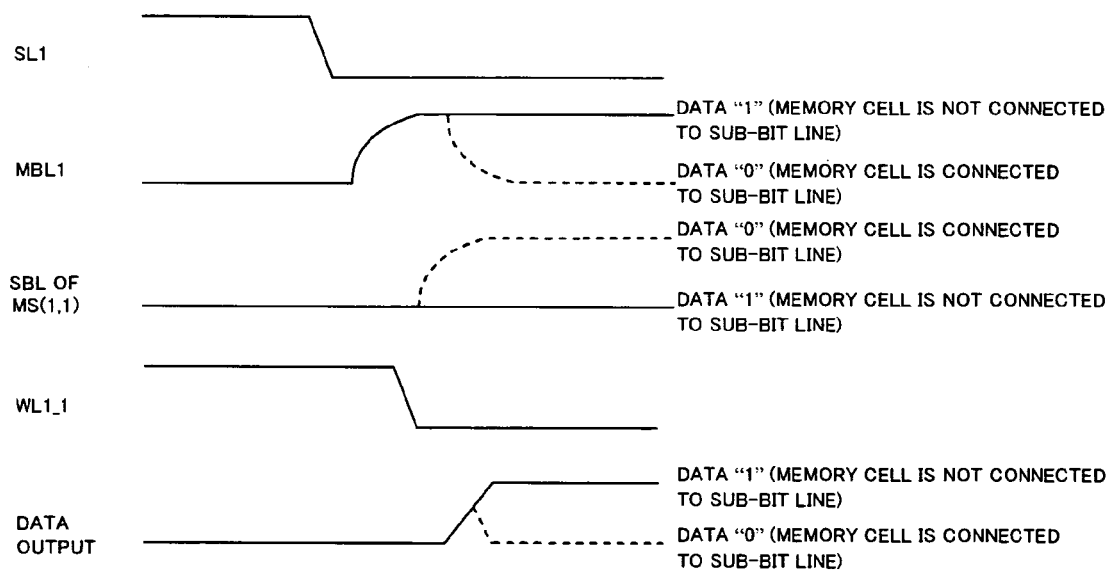
FIG. 2 is a timing chart showing operation of the semiconductor memory device according to the first embodiment of the invention.

The operation of reading data from, for example, the memory cell MP1 of the subarray MS (1, 1) included in the semiconductor memory device having such a configuration will be described with reference to a timing chart of FIG. 2.

In response to an address input, a block selection signal SL1 is made to transition to a "L" level, the sub-bit line resetting transistor QNR of the subarray MS (1, 1) is turned off, and the bit line MBL1 and a read circuit 5 are brought into conduction by a column decoder 4. Thereafter, through the use of the precharge function of the read circuit 5, the bit line MBL1 is charged for a fixed time period to make it to transition to a "H" level, following which the word line WL1_1 is made to transition to the "L" level.

Because of this, when the drain of the memory cell MP1 included in the subarray MS (1, 1) is connected to the sub-bit line SBL, the sub-bit line SBL is charged by the memory cell MP1 to be pulled up to the "H" level. As a result, the bit line driving transistor QND, which receives input from the sub-bit line SBL at its gate, is turned on and an electric charge supplied to the bit line MBL1 is discharged by the bit line driving transistor QND, thereby the bit line MBL1 is pulled down to the "L" level.

When the drain of the memory cell MP1 is not connected to the sub-bit line SBL, the sub-bit line SBL is at the "L" level without being charged by the memory cell MP1. On account of this, the bit line driving transistor QND is in an off state and the bit line MBL1 keeps the "H" level without the discharge of the electric charge supplied to the bit line MBL1.

As a consequence, when the drain of the memory cell MP1 is connected to the sub-bit line SBL, the read circuit 5 outputs "L" level data to the outside and when the drain of the memory cell MP1 is not connected to the sub-bit line SBL, the read circuit 5 outputs "H" level data to the outside.

As described above, according to the first embodiment, the subarrays can be formed without providing transistors which connect the bit lines MBLj (j=1 to n) and the sub-bit lines SBL of the subarrays MS (i, j) (i=1 to m and j=1 to n). Because of this, the influence of a substrate bias effect is eliminated in contrast to the conventional art semiconductor memory device, a high-speed operation can be realized even at a low power supply voltage, and then a read limit can also be obtained at a lower voltage.

In this embodiment, the bit line resetting transistor QNR is provided to each subarray; however, the number of the transistors constituting the memory cell array 1 can be reduced by providing one common bit line resetting transistor QNR to the plural subarrays connected to the same block selection line SLi (i=1 to m), thereby the effect of reducing the area of the semiconductor memory device can be obtained.

Incidentally, in the first embodiment, the state of connecting the drains of the memory cells and the sub-bit lines and the state of not connecting them are brought into correspondence with "0" and "1" of data respectively; in a mask ROM a state in which the threshold value of memory cells is low or a state in which it is high is brought into correspondence with "0" or "1" of data by connecting the drains of all the memory cells to sub-bit lines as well, the same effect can be obtained.

Second Embodiment

Figure 3:
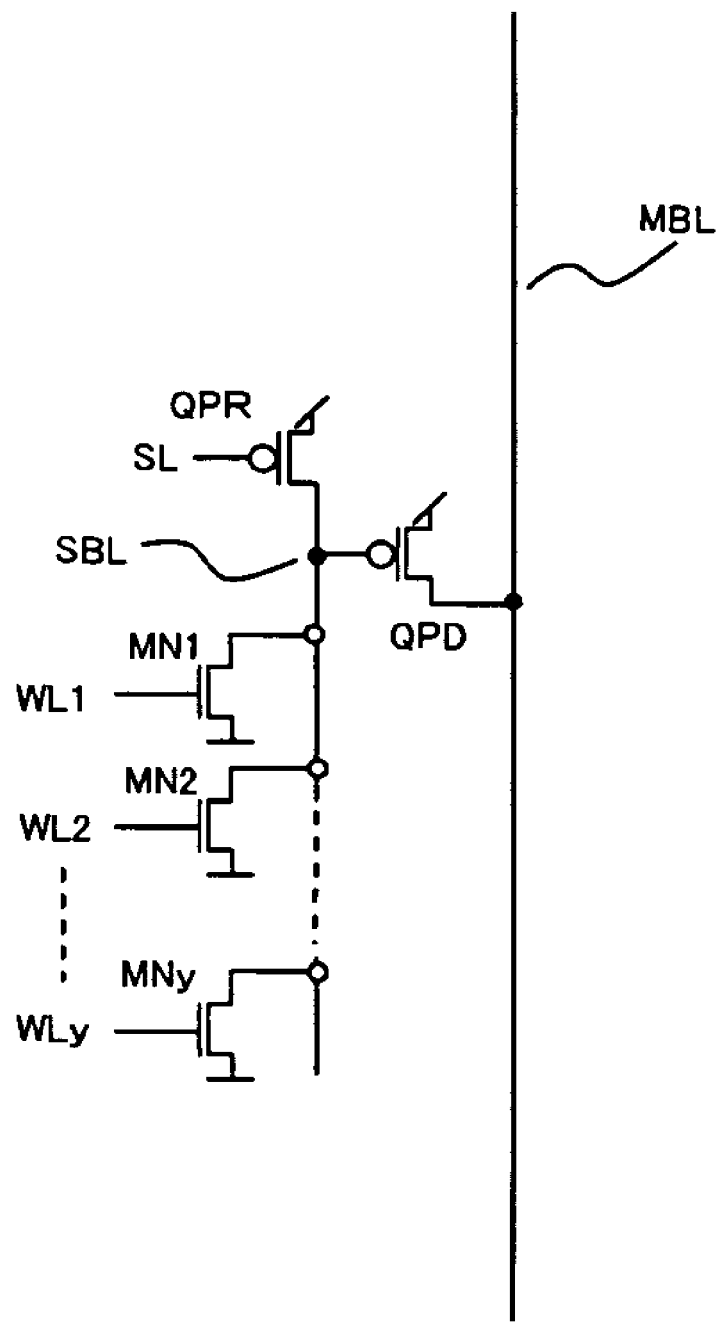
FIG. 3 is a circuit diagram of a configuration of a subarray included in a semiconductor memory device according to a second embodiment of the invention.

FIG. 3 is a circuit diagram showing a subarray MS (i, j) (i=1 to m and j=1 to n) which is included in the memory cell array 1 of a semiconductor memory device according to a second embodiment of the invention (see FIG. 11).

The subarray MS (i, j) (i=1 to m and j=1 to n) shown in FIG. 3 comprises a bit line driving transistor QPD which is a P-type MOS transistor, memory cells MNk (k=1 to y) each comprised of a N-type MOS transistor, and a bit line resetting transistor QPR which is a P-type MOS transistor.

In the bit line driving transistor QPD, a gate is connected to a sub-bit line SBL, a drain is connected to a bit line MBL, and a source is connected to an interconnection having a power supply potential.

In the memory cells MNk (k=1 to y) which drive the sub-bit line SBL, gates are connected to word lines WLk (k=1 to y) and sources are connected to an interconnection having a ground potential. When stored data is "1", the drains of the memory cells MNk (k=1 to y) are connected to the sub-bit line SBL and when the stored data is "0", the sub-bit line SBL is brought to a floating state.

In the bit line resetting transistor QPR, a gate is connected to a block selection line SL, a drain is connected to the sub-bit line SBL, and a source is connected to the interconnection having the power supply potential.

Moreover, in the memory cell array 1 shown in FIG. 11, the block selection line SL, the word lines WLk (k=1 to y), and the bit line MBL are connected with corresponding block selection lines SLi (i=1 to m), word lines WLk_i (k=1 to y and i=1 to m), and bit lines MBLj (j=1 to n) of other corresponding subarrays MS (i, j) (i=1 to m and j=1 to n) respectively.

Figure 4:
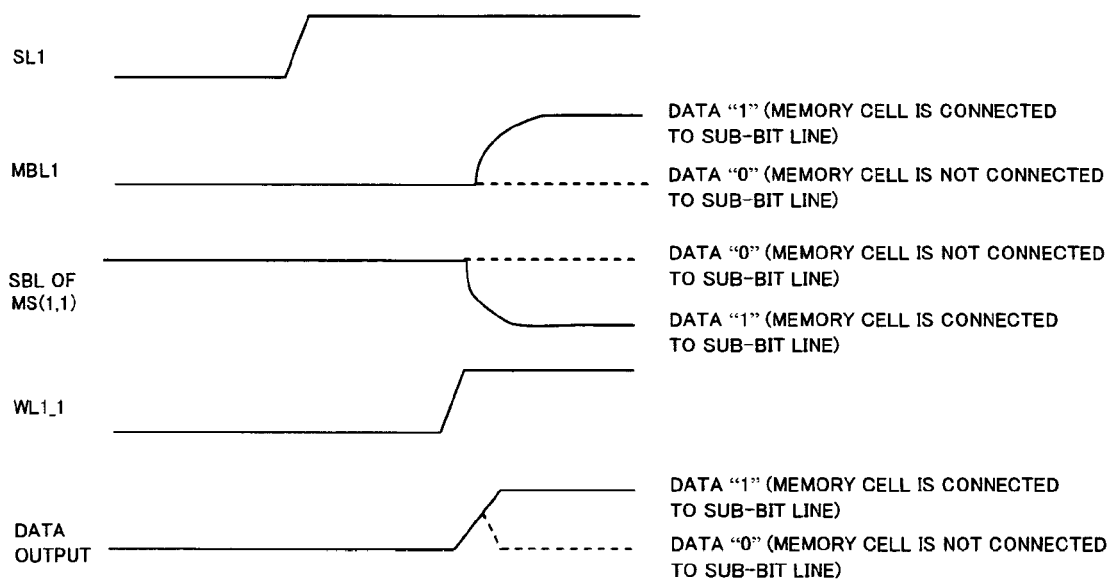
FIG. 4 is a timing chart showing operation of the semiconductor memory device according to the second embodiment of the invention.

The operation of reading data from, for example, the memory cell MN1 of the subarray MS (1, 1) included in the semiconductor memory device having such a configuration will be described with reference to a timing chart of FIG. 4.

In response to an address input, a block selection signal SL1 is made to transition to a "H" level, the bit line resetting transistor QPR of the subarray MS (1, 1) is turned off, and the bit line MBL1 and the read circuit 5 are brought into conduction by the column decoder 4. Thereafter, the bit line MBL1 is discharged for a fixed time period by using the discharge function of the read circuit 5 to be pulled down to the "L" level, following which the word line WL1_1 is made to transition to the "H" level.

Because of this, when the drain of the memory cell MN1 of the subarray MS (1, 1) is connected the sub-bit line SBL, the line SBL is discharged by the memory cell MN1 to be pulled down to the "L" level. As a result, the bit line driving transistor QPD, which receives input sent from the sub-bit line SBL at its gate, is turned on and the bit line MBL1 is charged to be pulled up to the "H" level.

When the drain of the memory cell MN1 is not connected to the sub-bit line SBL, the line SBL is at the "H" level without being discharged by the memory cell MN1. On account of this, the bit line driving transistor QPD is turned off and the bit line MBL1 is pulled down to the "L" level without being charged.

As a consequence, when the drain of the memory cell MN1 is connected to the sub-bit line SBL, the read circuit 5 outputs "H" level data to the outside and when the drain of the memory cell MN1 is not connected to the sub-bit line SBL, the read circuit 5 outputs "L" level data to the outside.

As described above, according to the second embodiment, it becomes possible to realize a high-speed operation at a low power supply voltage and obtain a read limit at a low voltage as in the case of the first embodiment, thereby the same effect as that described in the first embodiment can be obtained.

In this embodiment, the bit line resetting transistor QPR is provided to each subarray; however, the number of the transistors constituting the memory cell array 1 can be reduced by providing one common bit line resetting transistor QNR to the plural subarrays connected to the same block selection line SLi (i=1 to m), thereby the effect of reducing the area of the semiconductor memory device can be obtained.

Incidentally, in a mask ROM where a state in which the threshold value of memory cells is low or a state in which it is high is brought into correspondence with "1" or "0" of data by connecting the drains of all the memory cells to sub-bit lines as in the case of the first embodiment as well, the same effect can be obtained.

Third Embodiment

Figure 5:
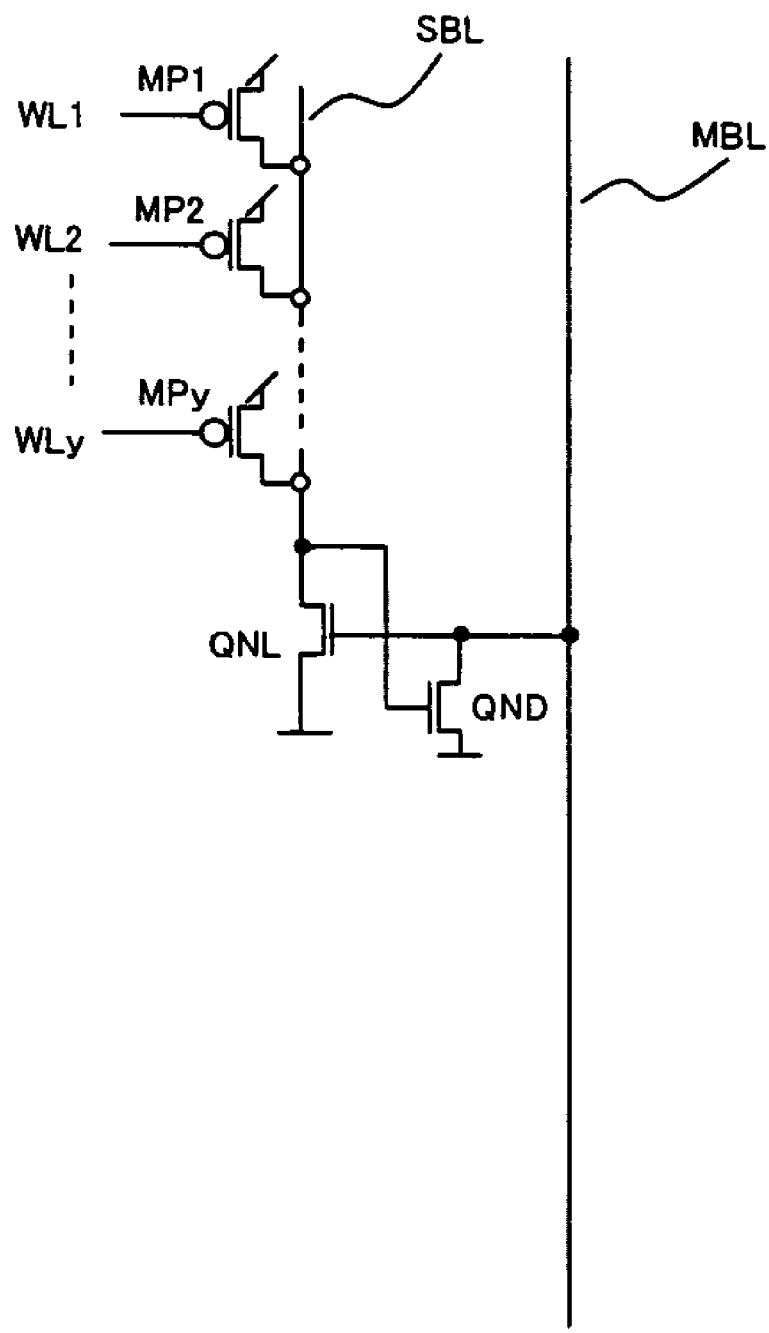
FIG. 5 is a circuit diagram of a configuration of a subarray included in a semiconductor memory device according to a third embodiment of the invention.

FIG. 5 is a circuit diagram of a subarray MS (i, j) (i=1 to m and j=1 to n) which is included in the memory cell array 1 of a semiconductor memory device according to a third embodiment of the invention (see FIG. 11).

The subarray MS (i, j) (i=1 to m and j=1 to n) shown in FIG. 5 comprises a bit line driving transistor QND which is a N-type MOS transistor, memory cells MPk (k=1 to y) each comprised of a P-type MOS transistor, a loading transistor QNL which is a N-type MOS transistor.

In the bit line driving transistor QND, a gate is connected to a sub-bit line SBL, a drain is connected to a bit line MBL, and a source is connected to an interconnection having a ground potential.

In the memory cells MPk (k=1 to y) which drive the sub-bit line SBL, gates are connected to word lines WLk (k=1 to y) and sources are connected to an interconnection having a power supply potential. When stored data is "0", the drains of the memory cells MPk (k=1 to y) are connected to the sub-bit line SBL and when the stored data is "1", the sub-bit line SBL is brought to the floating state.

In the loading transistor QNL, a gate is connected to the bit line MBL, a drain is connected to the sub-bit line SBL, and a source is connected to the interconnection having the ground potential. In this case, the ON-state current of the loading transistor QNL is set so as to become smaller than the ON-state current of the memory cells MPK (k=1 to y).

Moreover, in the memory cell array 1 shown in FIG. 11, the word lines WLk (k=1 to y) and the bit line MBL are connected to corresponding word lines WLk_i (k=1 to y and i=1 to m) and bit lines MBLj (j=1 to n) of the subarrays MS (i, j) (i=1 to m and j=1 to n) respectively.

In the memory cell array 1, the block selection lines SLi (i=1 to m) are connected to the block selection lines SL of the subarrays MS (i, j) (i=1 to m and j=1 to n) respectively; in the third embodiment, the block selection lines SLi cannot be used as signal lines without being connected to the transistors in the subarrays MS (i, j) (i=1 to m and j=1 to n).

Figure 6:
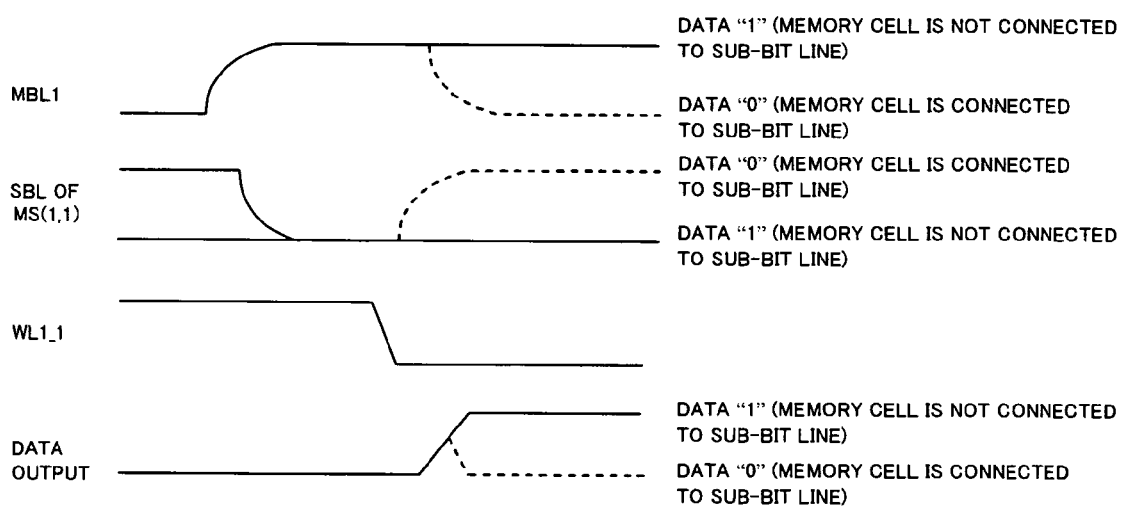
FIG. 6 is a timing chart showing operation of the semiconductor memory device according to the third embodiment and a semiconductor memory device according to a fifth embodiment of the invention.

The operation of reading data from, for example, the memory cell MP1 of the subarray MS (1, 1) of the semiconductor memory device having such a configuration will be described with reference to a timing chart of FIG. 6.

In response to an address input, the bit line MBL1 and the read circuit 5 are brought into conduction by the column decoder 4, the bit line MBL1 is charged for a fixed time period by using the precharge function of the read circuit 5 to make the bit line MBL1 to transition to the "H" level, and the loading transistor QNL is turned on. As a consequence, the sub-bit line SBL is made to transition to the "L" level, following which the word line WL1_1 is made to transition to the "L" level.

Because of this, when the drain of the memory cell MP1 of the subarray MS (1, 1) is connected to the sub-bit line SBL, the sub-bit line SBL transitions to the "H" level and the bit line driving transistor QND is turned on. As a result, the charge supplied to the bit line MBL1 is discharged by the transistor QND, so that the bit line MBL1 transitions to the "L" level. At the time, the loading transistor QNL is turned off and the sub-bit line SBL is brought to the state of charge at all times without being brought to the floating state by the on-state memory cell MP1.

When the drain of the memory cell MP1 is not connected to the sub-bit line SBL, the line SBL is at the "L" level without being charged by the memory cell MP1. On account of this, the bit line driving transistor QND is in the off state and the bit line MBL1 is pulled up to the "H" level because the charge supplied to the bit line MBL1 is not discharged by the transistor QND. At this time, the sub-bit line SBL is brought to the state of discharge at all times without being brought to a floating state temporarily because the loading transistor QNL is in the on state.

As a result, when the drain of the memory cell MP1 is connected to the sub-bit line SBL, the read circuit 5 outputs "L" level data to the outside and when the drain of the memory cell MP1 is not connected to the sub-bit line SBL, the read circuit 5 outputs "H" level data to the outside.

As described above, according to the third embodiment, it becomes possible to achieve a high-speed operation at a low power supply voltage and obtain a read limit at a low voltage as in the case of the first embodiment and it is possible to obtain the same effect as that described in the first embodiment.

In addition, since there is no time period during which the sub-bit lines are brought to the floating state at the time of read, the sub-bit lines are at the "H" or "L" level at all times. Because of this, the potential of the sub-bit lines does not fluctuate significantly by virtue of interference from the interconnections provided near the subarrays from which data is to be read, which makes the degree of freedom in the interconnections in the memory cell array high, thereby the area of the semiconductor memory device can be reduced.

Fourth Embodiment

Figure 7:
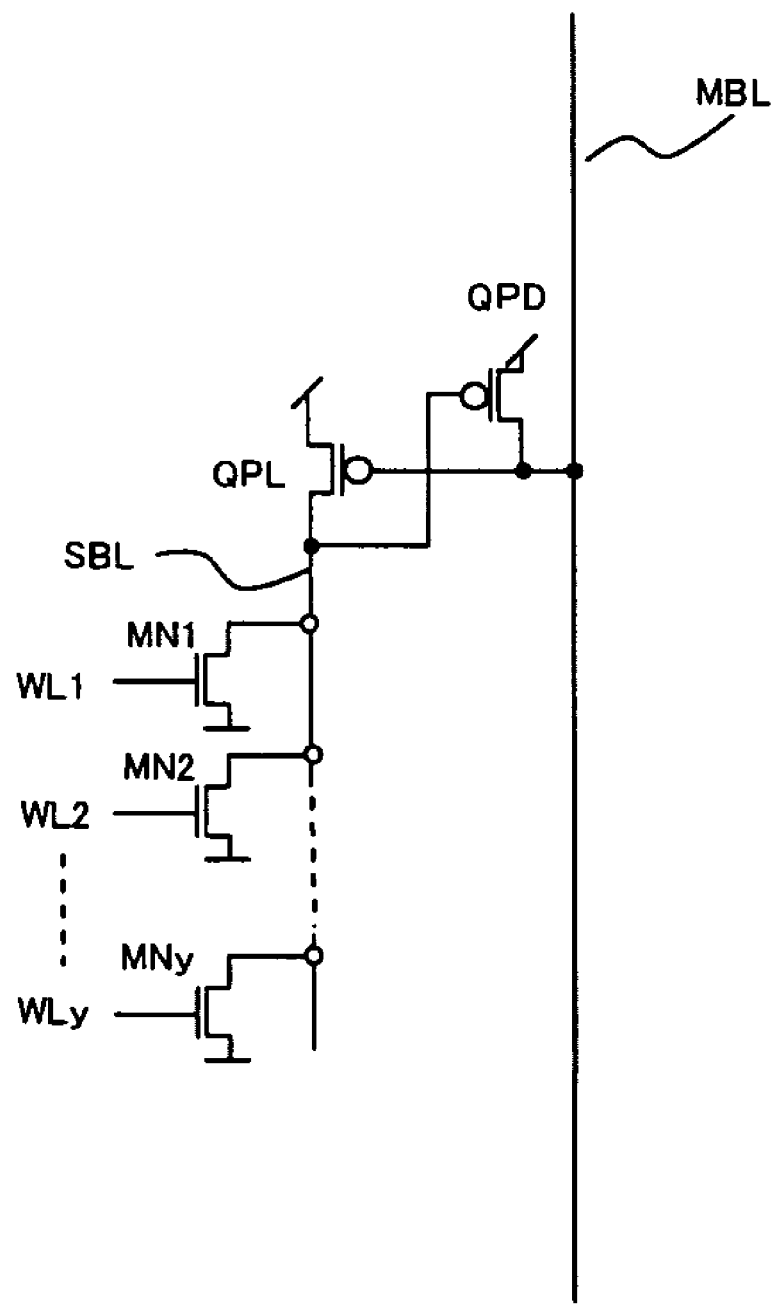
FIG. 7 is a circuit diagram of a configuration of a subarray included in a semiconductor memory device according to a fourth embodiment of the invention.

FIG. 7 is a circuit diagram of a subarray MS (i, j) (i=1 to m and j=1 to n) which is included in the memory cell array 1 of a semiconductor memory device according to a fourth embodiment of the invention (see FIG. 11).

The subarray MS (i, j) (i=1 to m and j=1 to n) shown in FIG. 7 comprises a bit line driving transistor QPD which is a P-type MOS transistor, memory cells MNk (k=1 to y) each comprised of a N-type MOS transistor, and a loading transistor QPL which is a P-type MOS transistor.

In the bit line driving transistor QPD, a gate is connected to the sub-bit line SBL, a drain is connected to the bit line MBL, and a source is connected to the interconnection having the power supply potential.

In the memory cells MNk (k=1 to y) which drive the sub-bit line SBL, gates are connected to the word lines WLk (k=1 to y) and sources are connected to the interconnection having the ground potential. When stored data is "1", the drains of the memory cells MNk (k=1 to y) are connected to the sub-bit line SBL and when the stored data is "0", the sub-bit line SBL is brought to the floating state.

In the loading transistor QPL, a gate is connected to the bit line MBL, a drain is connected to the sub-bit line SBL, and a source is connected to the interconnection having the power supply potential. In this case, the ON-state current of the loading transistor QPL is set so as to become smaller than the ON-state current of the memory cells MNk (k=1 to y).

Moreover, in the memory cell array 1 shown in FIG. 11, the word lines WLk (k=1 to y) and the bit line MBL are connected to corresponding word lines WLk_i (k=1 to y and i=1 to m) and bit lines MBLj (j=1 to n) of the subarrays MS (i, j) (i=1 to m and j=1 to n) respectively.

In the memory cell array 1, the block selection lines SLi (i=1 to m) are connected to the block selection lines SL of the subarrays MS (i, j) (i=1 to m and j=1 to n) respectively; in this embodiment, the block selection lines cannot be used as signal lines without being connected to the transistors in the subarrays MS (i, j) (i=1 to m and j=1 to n).

Figure 8:
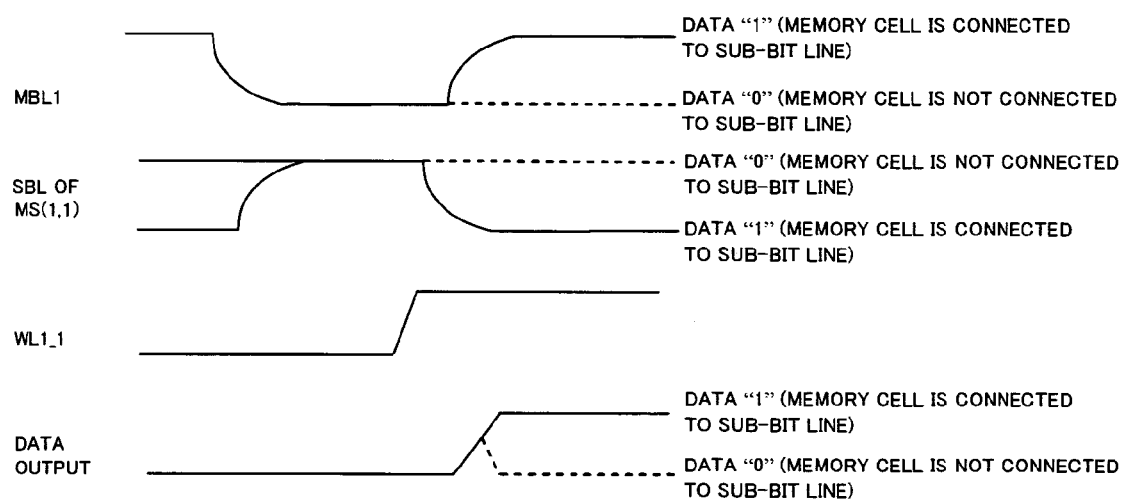
FIG. 8 is a timing chart showing operation of the semiconductor memory device according to the fourth embodiment and a semiconductor memory device according to a sixth embodiment of the invention.

The operation of reading data from, for example, the memory cell MN1 of the subarray MS (1, 1) of the semiconductor memory device having such a configuration will be described with reference to a timing chart of FIG. 8.

In response to an address input, the bit line MBL1 and the read circuit 5 are brought into conduction by the column decoder 4, the bit line MBL1 is discharged for a fixed time period by using the discharge function of the read circuit 5 to be made to transition to the "L" level, and the loading transistor QPL is turned on. As a result of this, the sub-bit line SBL is made to transition to the "H" level, following which the word line WL1_1 is made to transition to the "H" level.

Because of this, when the drain of the memory cell MN1 of the subarray MS (1, 1) is connected to the sub-bit line SBL, the line SBL transitions to the "L" level. As a consequence, the bit line driving transistor QPD is turned on and the bit line MBL1 is charged to transition to the "H" level. At this time, the loading transistor QPL is turned off and the sub-bit line SBL is brought to the state of discharge at all times by the on-state memory cell MN1 without being brought to the floating state.

When the drain of the memory cell MN1 is not connected to the sub-bit line SBL, the line SBL is at the "H" level without being discharged by the memory cell MN1. On account of this, the bit line driving transistor QPD is in the off state and the bit line MBL1 is kept at the "L" level without being charged. At this time, the sub-bit line SBL is brought to the state of charge at all times without being brought to the floating state temporarily because the loading transistor QPL is turned on.

As a result, when the drain of the memory cell MN1 is connected to the sub-bit line SBL, the read circuit 5 outputs "H" level data to the outside and when the drain of the memory cell MN1 is not connected to the sub-bit line SBL, the read circuit 5 outputs "L" level data to the outside.

As described above, according to the fourth embodiment, it becomes possible to achieve a high-speed operation at a low power supply voltage and obtain a read limit at a low voltage as in the case of the first embodiment, and then it is possible to obtain the same effect as that described in the first embodiment.

Moreover, since there is no time period during which the sub-bit lines are brought to the floating state at the time of the read as in the case of the third embodiment, the sub-bit lines are at the "H" or "L" level at all times. Because of this, the potential of the sub-bit lines does not fluctuate significantly by virtue of interference from the interconnections provided near the subarrays from which data is to be read, which makes the degree of freedom in the interconnections in the memory cell array high, thereby the area of the semiconductor memory device can be reduced.

Incidentally, in a mask ROM where a state in which the threshold values of the memory cells are low or a state in which they are high is brought into correspondence with "1" or "0" of data by connecting the drains of all the memory cells to the sub-bit lines as in the case of the first embodiment as well, the same effect can be obtained.

Fifth Embodiment

Figure 9:
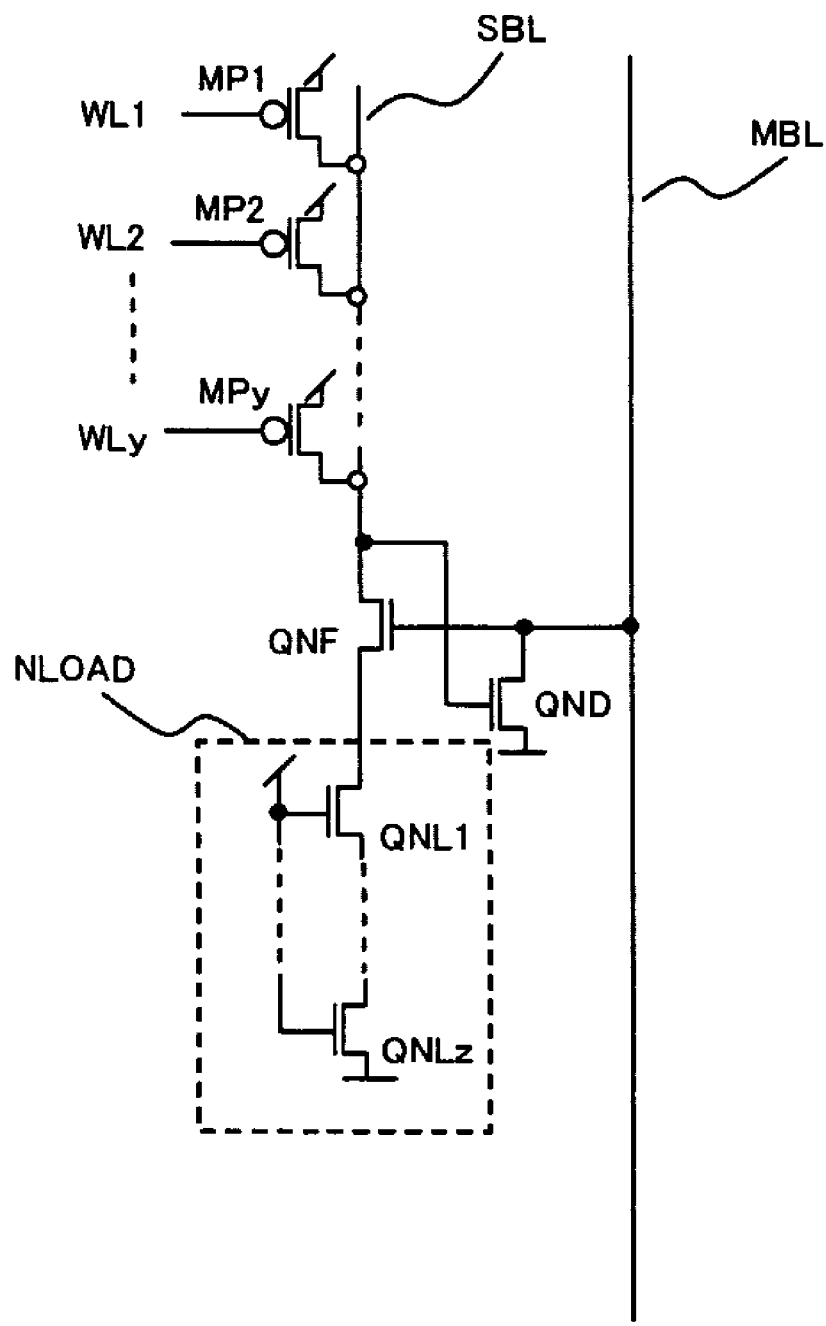
FIG. 9 is a circuit diagram of a configuration of a subarray included in the semiconductor memory device according to the fifth embodiment of the invention.

FIG. 9 is a circuit diagram of a subarray MS (i, j) (i=1 to m and j=1 to n) which is included in the memory cell array 1 of a semiconductor memory device according to a fifth embodiment of the invention (see FIG. 11).

The subarray MS (i, j) (i=1 to m and j=1 to n) shown in FIG. 9 comprises a bit line driving transistor QND which is a N-type MOS transistor, memory cells MPk (k=1 to y) each comprised of a P-type MOS transistor, a transmission transistor QNF which is a N-type MOS transistor, and a loading transistor section NLOAD comprised of N-type MOS transistors QNLl (l=1 to z).

In the bit line driving transistor QND, a gate is connected to the sub-bit line SBL, a drain is connected to the bit line MBL, and a source is connected to the interconnection having the ground potential.

In the memory cells MPk (k=1 to y) which drive the sub-bit line SBL, gates are connected to the word lines WLk (k=1 to y), and sources are connected to the interconnection having the power supply potential. When stored data is "0", the drains of the memory cells MPk (k=1 to y) are connected to the sub-bit line SBL and when the stored data is "1", the sub-bit line SBL is brought to the floating state.

In the transmission transistor QNF, a gate is connected to the bit line MBL, a drain is connected to the sub-bit line SBL, and a source is connected to the loading transistor section NLOAD.

In the loading transistor section NLOAD, gates of the transistors QNLl (l=1 to z) are connected to the interconnection having the power supply potential, sources are connected in series to drains of the next transistors QNL1, the drain of the transistor QNl1 positioned at one end of the section NLOAD is connected to the source of the transmission transistor QNF, and the source of the transistor QNLz positioned at the other end is connected to the interconnection having the ground potential.

In this case, a current, which flows between the drain of the transistor QNL1 and the source of the transistor QNLz in the loading transistor section NLOAD, is set so as to become smaller than the ON-state current of the memory cells MPk (k=1 to y).

Moreover, in the memory cell array 1 shown in FIG. 11, the word lines WLk (k=1 to y) and the bit line BL are connected to corresponding word lines WLk_i (k=1 to y and i=1 to m) and bit lines MBLj (j=1 to n) of the subarrays MS (i, j) (i=1 to m and j=1 to n) respectively.

In the memory cell array 1, the block selection lines SLi (i=1 to m) are connected to the block selection lines SL of the subarrays MS (i, j) (i=1 to m and j=1 to n) respectively; in the fifth embodiment, the block selection lines SLi cannot be used as signal lines without being connected to the transistors in the subarrays MS (i, j) (i=1 to m and j=1 to n).

As in the case of the third embodiment, the operation of reading data from, for example, the memory cell MP1 of the subarray MS (1, 1) of the semiconductor memory device having such a configuration will be described with reference to the timing chart of FIG. 6.

In response to an address input, the bit line MBL1 and the read circuit 5 are brought into conduction by the column decoder 4, the bit line MBL1 is charged for a fixed time period by using the precharge function of the read circuit 5 to be made to transition to the "H" level, and the transmission transistor QNF is turned on. As a result of this, the sub-bit line SBL is made to transition to the "L" level, following which the word line WL1_1 is made to transition to the "L" level.

Because of this, when the drain of the memory cell MP1 of the subarray MS (1, 1) is connected to the sub-bit line SBL, the line SBL transitions to the "H" level. As a consequence, the bit line driving transistor QND is turned on and the charge supplied to the bit line MBL1 is discharged by the bit line driving transistor QND, so that the bit line MBL1 transitions to the "L" level. At this time, the transmission transistor QNF is turned off and the sub-bit line SBL is brought to the state of charge at all times by the on-state memory cell MP1 without being brought to the floating state.

When the drain of the memory cell MP1 is not connected to the sub-bit line SBL, the line SBL is at the "L" level without being charged by the memory cell MP1. On account of this, the bit line driving transistor QND is in the off state, so that the bit line MBL1 is pulled up to the "H" level because a charge supplied to the bit line MBL1 is not discharged by the transistor QND. At this time, the transmission transistor QNF is turned on, thereby the sub-bit line SBL is brought to the state of discharge at all times without being brought to the floating state temporarily.

As a result, when the drain of the memory cell MP1 is connected to the sub-bit line SBL, the read circuit 5 outputs "L" level data to the outside and when the drain of the memory cell MP1 is not connected to the sub-bit line SBL, the read circuit 5 outputs "H" level data to the outside.

As described above, according to the fifth embodiment, it becomes possible to achieve a high-speed operation at a low power supply voltage and obtain a read limit at a low voltage as in the case of the first embodiment, and then it is possible to obtain the same effect as that described in the first embodiment. Besides, as in the case of the third embodiment, there is no time period during which the sub-bit lines are brought to the floating state at the time of read and the area of the semiconductor memory device can be reduced.

Furthermore, in this embodiment, since the transistors constituting the loading transistor sections are not direct-connected to the bit lines even when the gate lengths of the transistors in the loading transistor sections are increased to make the ON-state currents of the loading transistor sections smaller than the ON-state currents of the memory cells, a high-speed operation can be achieved without increasing the load capacities of the bit lines.

Moreover, in the fifth embodiment, the loading transistor sections are constituted by the plural loading transistors connected in series one after the other, while even when the loading transistor sections are each made up of a single loading transistor whose ON-state current is smaller than that of the memory cells, the same effect can be obtained.

Incidentally, in a mask ROM where a state in which the threshold values of the memory cells are low or a state in which they are high is brought into correspondence with "0" or "1" of data by connecting all the drains of the memory cells to the sub-bit lines as in the case of the first embodiment as well, the same effect can be obtained.

Sixth Embodiment

Figure 10:
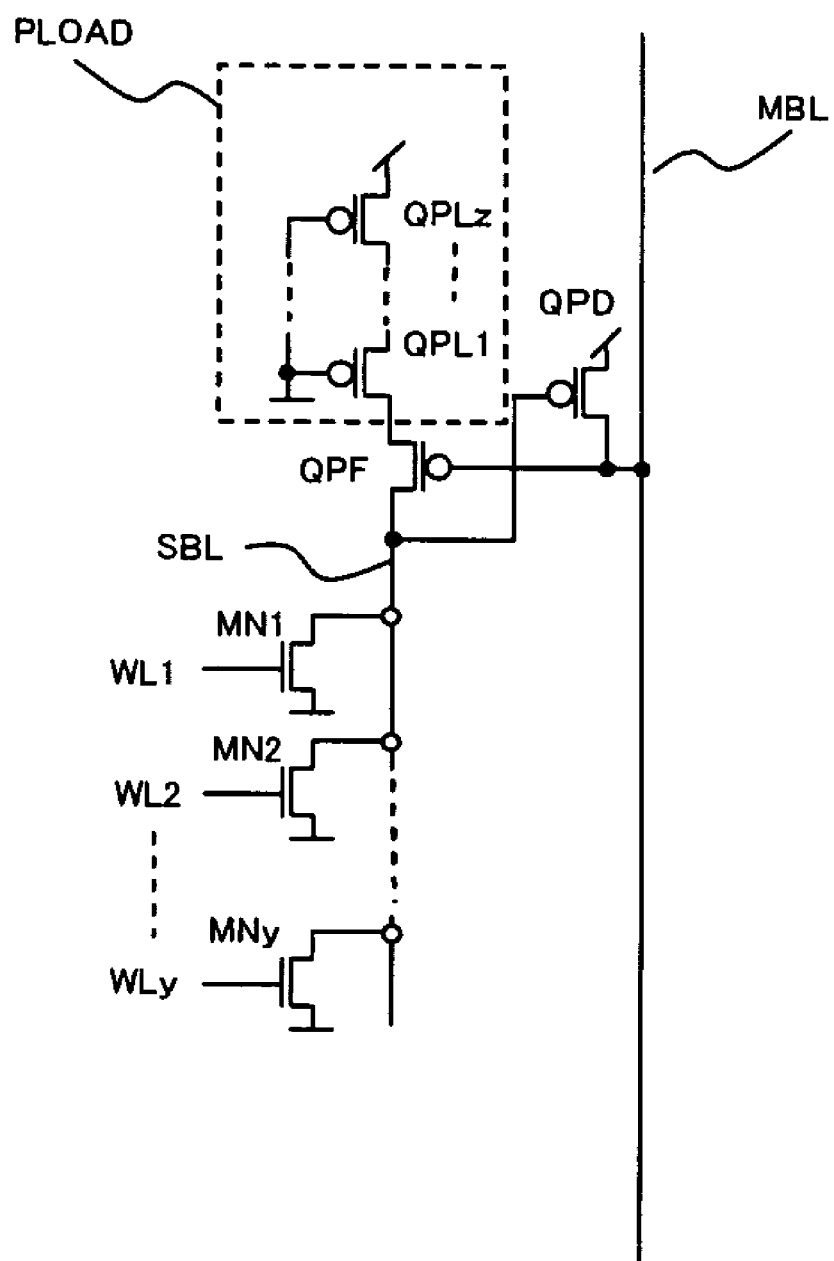
FIG. 10 is a circuit diagram of a configuration of a subarray included in the semiconductor memory device according to the sixth embodiment of the invention.

FIG. 10 is a circuit diagram of a subarray MS (i, j) (i=1 to m and j=1 to n) which is included in the memory cell array 1 of a semiconductor memory device according to a sixth embodiment of the invention (see FIG. 11).

The subarray MS (i, j) (i=1 to m and j=1 to n) shown in FIG. 10 comprises a bit line driving transistor QPD which is a P-type MOS transistor, memory cells MNk (k=1 to y) each comprised of a N-type MOS transistor, a transmission transistor QPF which is a P-type MOS transistor, and a loading transistor section PLOAD comprised of P-type MOS transistors QPL1 (l=1 to z)

In the bit line driving transistor QPD, a gate is connected to the sub-bit line SBL, a drain is connected to the bit line MBL, and a source is connected to the interconnection having the power supply potential.

In the memory cells MNk (k=1 to y) which drive the sub-bit line SBL, gates are connected to the word lines WLk (k=1 to y) and sources are connected to the interconnection having the ground potential. When stored data is "1", the drains of the memory cells MNk (k=1 to y) are connected to the sub-bit line SBL and when stored data is "0", the sub-bit line SBL is brought to the floating state.

In the transmission transistor QPF, a gate is connected to the bit line MBL, a drain is connected to the sub-bit line SBL, and a source is connected to the loading transistor section PLOAD.

In the loading transistor section PLOAD, gates of the transistors QPL1 (l=1 to z) are connected to the interconnection having the power supply potential, sources are connected in series with drains of the next transistors QPL1, the drain of the transistor QPL1 positioned at one end of the loading transistor section PLOAD is connected to the source of the transmission transistor QNF, and the source of the transistor QNLz positioned at the other end is connected to the interconnection having the power supply potential.

In this case, a current which flows between the source of the transistor QPLz and the drain of the transistor QPL1 in the loading transistor section PLOAD is set so as to become smaller than the ON-state currents of the memory cells MNk (k=1 to y).

Moreover, in the memory cell array 1 shown in FIG. 11, the word lines WLk (k=1 to y) and the bit line BL are connected to corresponding word lines WLk_i (k=1 to y and i=1 to m) and bit lines MBLj (j=1 to n) of the subarrays MS (i, j) (i=1 to m and j=1 to n) respectively. In the memory cell array 1, the block selection lines SLi (i=1 to m) are connected to the block selection lines SL of the subarrays MS (i, j) (i=1 to m and j=1 to n) respectively; in the sixth embodiment, the block selection lines SLi cannot be used as signal lines without being connected to the transistors in the subarrays MS (i, j) (i=1 to m and j=1 to n).

As in the case of the fourth embodiment, the operation of reading data from, for example, the memory cell MP1 of the subarray MS (1, 1) of the semiconductor memory device having such a configuration will be described with reference to the timing chart of FIG. 8.

In response to an address input, the bit line MBL1 and the read circuit 5 are brought into conduction by the column decoder 4, the bit line MBL1 is discharged for a fixed time period by using the precharge function of the read circuit 5 to be made to transition to the "L" level, and the transmission transistor QPF is turned on. As a result, the sub-bit line SBL is made to transition to the "H" level, following which the word line WL1_1 is made to transition to the "H" level.

Therefore, when the drain of the memory cell MN1 in the subarray MS (1, 1) is connected to the sub-bit line SBL, the line SBL transitions to the "L" level. As a consequence, the bit line driving transistor QPD is turned on and the bit line MBL1 is charged by the bit line driving transistor QPD to transition to the "H" level. At this time, the transmission transistor QPF is turned off and the sub-bit line SBL is brought to the state of discharge at all times by the on-state memory cell MN1 without being brought to the floating state.

When the drain of the memory cell MN1 is not connected to the sub-bit line SBL, the line SBL is at the "H" level without being discharged by the memory cell MN1. Because of this, the bit line driving transistor QPD is in the off state and the bit line MBL1 is pulled down to the "L" level without being charged by the transistor QPD. At this time, the sub-bit line SBL is brought to the state of charge at all times without being brought to the floating state temporarily because the transmission transistor QPF is turned on.

As a result, when the drain of the memory cell MN1 is connected to the sub-bit line SBL, the read circuit 5 outputs "H" level data to the outside and when the drain of the memory cell MN1 is not connected to the sub-bit line SBL, the read circuit 5 outputs "L" level data to the outside.

As described above, according to the sixth embodiment, it becomes possible to achieve a high-speed operation at a low power supply voltage and obtain a read limit at a low voltage as in the case of the first embodiment and it is possible to obtain the same effect as that described in the first embodiment. Besides, as in the case of the fourth embodiment, there is no time period during which the sub-bit lines are brought to the floating state at the time of read and it becomes possible to manufacture the semiconductor memory device having a reduced area.

Moreover, in this embodiment, since the transistors constituting the loading transistor sections are not direct-connected to the bit lines even when the gate lengths of the transistors in the loading transistor sections are increased to make the ON-state currents of the loading transistor sections smaller than those of the memory cells, a high-speed operation can be achieved without increasing the load capacities of the bit lines.

Furthermore, in the sixth embodiment, the loading transistor sections are constituted by the plural loading transistors connected in series one after the other, while even when the loading transistor sections are each made up of a single loading transistor whose ON-state current is smaller than that of the memory cells, the same effect can be obtained.

Incidentally, in a mask ROM where a state in which the threshold values of the memory cells are low or a state in which they are high is brought into correspondence with "0" or "1" of data by connecting all the drains of the memory cells to the sub-bit lines as in the case of the first embodiment as well, the same effect can be obtained.

INDUSTRIAL APPLICABILITY

The semiconductor memory device according to the present invention has a configuration in which transistors, which are used for selectively connecting bit lines and sub-bit lines, are provided in such a way that sources are connected to interconnections having a power supply potential or a ground potential, drains are connected to the bit lines, and gates are connected to the sub-bit lines instead of connecting the drains and the sources to the bit lines and the sub-bit lines respectively; therefore the semiconductor memory device is useful as a product embodying a technique for manufacturing the circuit in which data are read from the memory cells at high speed in a low-voltage range, in which the influence of the threshold value increased by the substrate bias effect becomes significant, and the read limit is set at a lower voltage.

The invention claimed is:

1. A semiconductor memory device comprising:
   a memory cell array which includes a plurality of subarrays arranged in the form of a matrix, and a plurality of word lines and a plurality of bit lines connected to the subarrays, the subarray comprising a bit line driving transistor which drives the bit line, a sub-bit line connected to the gate of the bit line driving transistor, and a plurality of memory cell transistors which are connected to the sub-bit line and drive the sub-bit line according to signals from the word lines, wherein:
   the bit line driving transistor has a drain connected to the bit line and a source connected to a first power potential supply line,
   the memory cell array further includes a plurality of block selection lines connected to the subarrays, and
   the subarray further has a resetting transistor having a gate connected to the block selection line, a source connected to the first power potential supply line, and a drain connected to the sub-bit line.

2. The semiconductor memory device according to claim 1, wherein the single resetting transistor is provided to the subarrays, which receive output from the same block selection line, as one common resetting transistor by connecting the drain of the common resetting transistor to the sub-bit lines of the subarrays.

3. The semiconductor memory device according to claim 1, wherein the memory cell transistors are each provided in such a way that a gate is connected to the word line, a source is connected to a second power potential supply line, and the connection of a drain to the sub-bit line depends on data to be stored.

4. The semiconductor memory device according to claim 1, wherein the memory cell transistors are each provided in such a way that the gate is connected to the word line, the source is connected to a second power potential supply line, the drain is connected to the sub-bit line, and a threshold value varies in correspondence to stored data.

* * * * *